United States Patent [19]

Kihara et al.

[11] Patent Number: 5,781,171
[45] Date of Patent: Jul. 14, 1998

[54] SHIFT REGISTER, DRIVING CIRCUIT AND DRIVE UNIT FOR DISPLAY DEVICE

[75] Inventors: Katsuya Kihara; Masayuki Koga, both of Hyogo, Japan

[73] Assignee: Sanyo Electric Co., Ltd., Osaka, Japan

[21] Appl. No.: 452,694

[22] Filed: May 30, 1995

[30] Foreign Application Priority Data

| May 30, 1994 | [JP] | Japan | 6-117153 |
| May 30, 1994 | [JP] | Japan | 6-117154 |
| Apr. 17, 1995 | [JP] | Japan | 7-90493 |

[51] Int. Cl.[6] ............................................. G09G 3/00
[52] U.S. Cl. ................... 345/93; 345/100; 327/526; 377/69; 377/54
[58] Field of Search .................. 324/770; 327/526; 345/93, 100, 92, 197, 204; 359/59; 377/54, 66, 69, 76, 77, 81; 349/54

[56] References Cited

U.S. PATENT DOCUMENTS

| 5,063,378 | 11/1991 | Roach | 345/93 |
| 5,465,053 | 11/1995 | Edwards | 345/93 |
| 5,555,001 | 9/1996 | Lee et al. | 345/93 |

FOREIGN PATENT DOCUMENTS

| WO9111796 | 8/1991 | WIPO | 345/93 |

*Primary Examiner*—Lun-Yi Lao
*Attorney, Agent, or Firm*—Nikaido, Marmelstein, Murray & Oram LLP

[57] ABSTRACT

A shift register has four systems of shift registers for bidirectional scans and normal/redundant lines. The respective systems of shift registers are divided into blocks, so that transmission circuits are provided therebetween. The transmission circuits form switching circuits through transfer gates. The transmission circuits receive output signals from both of the shift registers for the normal/redundant lines, and output only normal output signals to next stage shift registers in accordance with control signals.

6 Claims, 18 Drawing Sheets

TO SAMPLING TRANSISTOR

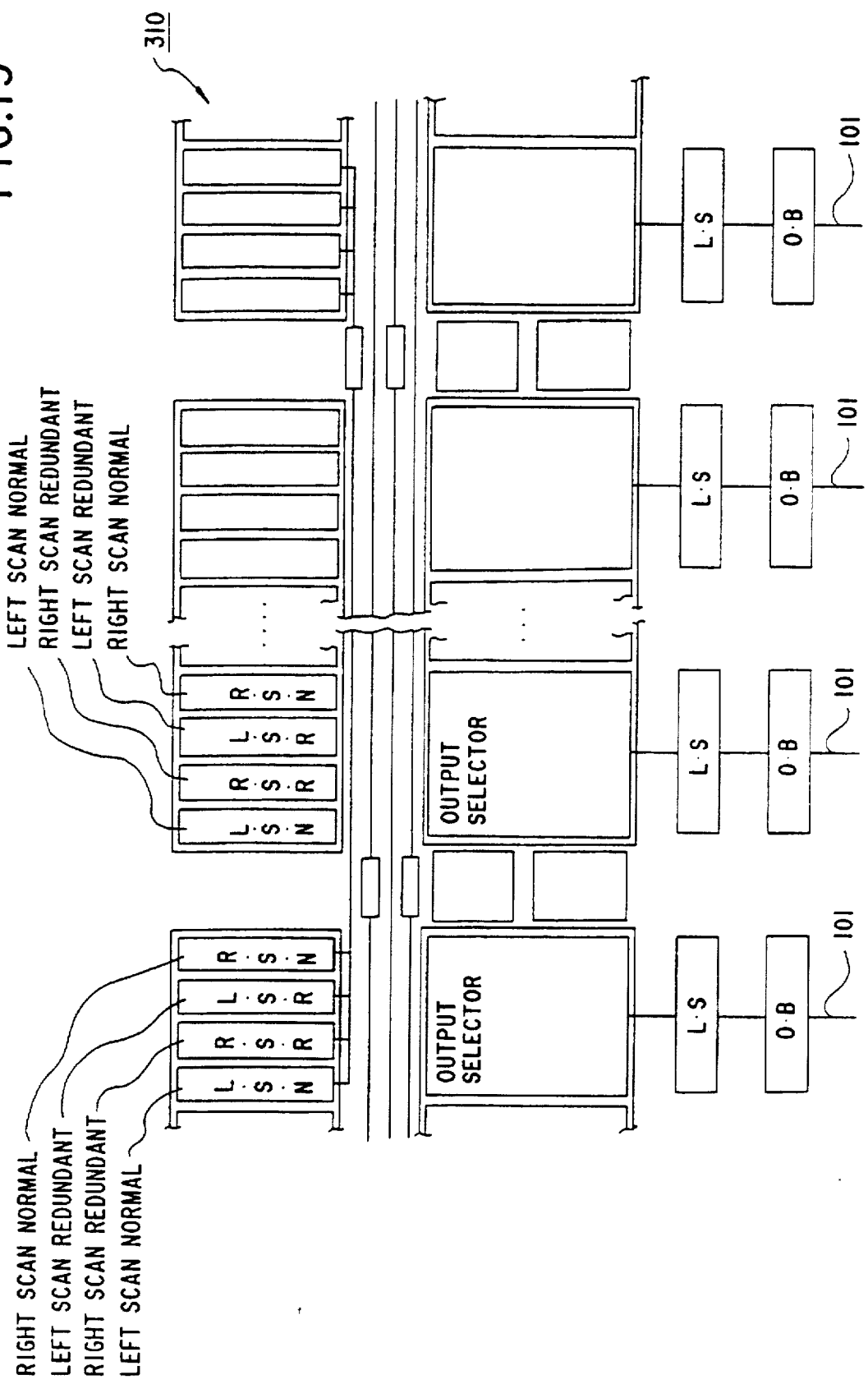

SHIFT REGISTER, DRIVING CIRCUIT AND DRIVE UNIT FOR DISPLAY DEVICE

BACKGROUND OF THE INVENTION

1. Field of the Invention

The present invention relates to structures of a shift register and a drive unit for a display device, which are improved in redundancy. The present invention also relates to structures of a shift register and a drive unit for a display device, which are capable of bidirectional scans.

2. Description of the Background Art

FIG. 12 shows an example of a conventional matrix type liquid crystal display device. The matrix type liquid crystal display device shown in FIG. 12 comprises a liquid crystal panel 100, a data driver 201 and a scan driver 301. The liquid crystal panel 100 has a plurality of scan electrodes 101 which are arranged in parallel with each other, and a plurality of signal electrodes 102 which are arranged in parallel with each other perpendicularly to the scan electrodes 101. TFTs (thin film transistors) 104 are provided in the vicinity of the intersections between the scan electrodes 101 and the signal electrodes 102, for driving pixel electrodes 103. The signal electrodes 102 of the liquid crystal panel 100 are connected to the data driver 201, while the scan electrodes 101 are connected to the scan driver 301.

The data driver 201 samples video signals which are inputted in this liquid display device, and supplies the same to the signal electrodes 102.

On the other hand, the scan driver 301 successively outputs scan pulses to the scan electrodes 101.

The data driver 201 and the scan driver 301 operate to supply the video signals to the respective pixel electrodes 103 of the liquid crystal panel 100 at prescribed timings, on the basis of control signals from a control circuit 400 which is provided in the exterior.

FIG. 13 schematically illustrates the structure of the data driver 201, particularly a shift register 210, and FIG. 14 illustrates the circuit structure of its principal part.

The data driver 201 has the shift register 210 of two systems of normal and redundant lines, a video line 250 for inputting the video signals from the exterior, and sampling transistors 260 carrying out switching operations for outputting the video signals received from the video line 250 to the signal electrodes 102.

In the shift register 210, shift register blocks 211a, 211b, ... 212a, 212b, ..., which are formed by classifying prescribed numbers of shift registers into blocks for the respective systems of the normal and redundant lines, are connected in parallel with each other. The shift register blocks are connected with each other by a NOR gate 230. Output signals from the same positions in the shift register blocks of the normal and redundant lines are outputted to the sampling transistors 260 through AND gates 240.

The data driver 201 operates as follows: Shift pulses (SP) which are outputted from the control circuit 400 are inputted from input terminals of the shift register blocks 211a and 212a of the normal and redundant lines. The shift register blocks 211a and 212a transmit the shift pulses at prescribed timings and successively output sampling pulses to the AND gates 240 which are formed by combining NANDs and inverters with each other, to allow conduction of the sampling transistors 260. The shift pulses reaching output ends of the shift register blocks 211a and 212a are inputted in the NOR gate 230, so that outputs thereof are outputted as shift pulses for the next stage shift register blocks 211b and 212b in accordance with NOR logic.

Thus, the shift register 210 transmits the shift pulses which are inputted from the input ends of the normal/redundant shift registers to the output ends while shifting the same, outputs the sampling pulses to the sampling transistors 260 through the AND gates 240 which are formed by combining NANDs and inverters with each other, and makes the video line 250 output the video signals toward the signal electrodes 102.

The video signals are outputted to the respective signal electrodes 102 at timings which are responsive to output signals from the control circuit 400, and added to prescribed liquid crystal cells in accordance with combinations with the scan electrodes 101 which are driven by the scan driver 301.

In recent years, a matrix type liquid crystal display device comprising a shift register which is capable of a bidirectional scan has also been proposed. One method of enabling a bidirectional scan is adapted to prepare shift registers for left and right scans by a method employing mask exchange in a preparation process. In this method, however, it is necessary to employ two types of masks in response to the scan directions, and hence the design cost and the manufacturing cost for these masks are disadvantageously increased. Therefore, a method employing a structure of enabling a bidirectional scan with a one-system shift register is proposed as another method.

In the liquid crystal display device according to the aforementioned prior art, however, a defect may be caused in the shift register of the data driver 201 or the scan driver 301 during the manufacturing steps for a driving circuit. Such a defect may disable transmission of the shift pulses in the shift register or outputs to the sampling transistors 260, for example.

Assuming that an output of a shift pulse is fixed at a high level in the first normal shift register block 211a in the former example with reference to FIG. 14, for example, the NOR gate 230 is supplied with a high input from the normal shift register block side, and hence its output goes low regardless of an input from the redundant shift register block side. Therefore, no shift pulse is transmitted to the subsequent shift register blocks.

On the other hand, when the output of the first shift normal register block 211a is fixed at a low level, for example, the AND gate 240 is supplied with a low input from the normal shift register block. In this case, the low output is added to the gate of the sampling transistor 260 regardless of the input in the redundant shift register block, to allow no conduction of the sampling transistor 260. Therefore, data from the video line 250 cannot be sampled.

When a defect is caused in a line of the conventional shift register, as hereinabove described, shift pulses are not transmitted.

In the latter example enabling a bidirectional scan in a one-system shift register, on the other hand, the shift register is extremely complicated in structure, disadvantageously leading to increase of a rate of defects which are caused in the element structure of the shift register in the manufacturing process. When a defect is caused in the shift register structure, the bidirectional scan is disabled to result in such a serious obstruction that the overall driving circuit is rendered inoperable.

SUMMARY OF THE INVENTION

An object of the present invention is to provide a shift register and a driving circuit for a display device which can transmit normal signals also when a defect is caused in a shift register line.

The driving circuit for a display device according to the present invention comprises a plurality of systems of shift register trains transmitting shift signals for successively selecting and driving signal electrodes or scan electrodes, and signal selection means receiving the shift signals which are transmitted through the plurality of systems of shift register trains respectively for selecting and outputting any one of the shift signals.

When abnormality is caused in a shift signal which is transmitted through any of the plurality of systems of shift register trains in the inventive driving circuit, the signal selection means selects and outputs a normal shift signal. Therefore, it is possible to transmit normal shift signals to a downstream side with no inhibition by an abnormal signal which is caused on an upstream side of the shift register trains.

In a limited structure of the present invention, the plurality of systems of shift register trains have a normal shift register train and a redundant shift register train. The signal selection means is provided with a switching circuit having a first transfer gate receiving a shift signal which is transmitted through one shift register train as an input, and a second transfer gate receiving a shift signal which is transmitted through another shift register train as an input, and allowing conduction of either gate in accordance with a control signal for outputting the shift signal.

In a further limited structure of the present invention, the selecting operation for the shift signal is carried out by allowing conduction of either one of the two transfer gates forming the switching circuit by the control signal thereby selecting and outputting a normal shift signal.

In another limited structure of the present invention, the signal selection means has a selection circuit which wired OR connects a first clocked inverter receiving a shift signal which is transmitted through the normal shift register train as an input and a second clocked inverter receiving a shift signal which is transmitted through the redundant shift register train as an input for selecting and outputting the input of either clocked inverter.

The selection circuit wired OR connecting the two clocked inverters selects and outputs only a normal shift signal from the two shift register trains in accordance with a control signal.

In a further limited structure of the present invention, the switching circuit or the selection circuit is connected between respective blocks of the normal and redundant shift register trains which are divided into prescribed units of blocks.

In a further limited structure of the present invention, the switching circuit or the selection circuit is connected between the normal and redundant shift register trains and the scan electrodes or a sampling transistor.

In a further limited structure of the present invention, the aforementioned structure of the switching circuit or the selection circuit is similarly applied to the structure of the shift register trains on a gate side.

The shift register according to the present invention comprises a plurality of systems of shift register trains, and signal selection means which selects and outputs a normal shift signal when abnormality is caused in a shift signal transmitted through any of the plurality of systems of shift register trains.

Another object of the present invention is to provide a shift register and a drive unit for a display device which can maintain at least a unidirectional scan function also when a defect is caused in the shift register capable of a bidirectional scan.

The drive unit for a display device according to the present invention has a shift register for successively outputting prescribed signals to a plurality of signal electrodes or scan electrodes which are connected with a plurality of pixels. The shift register has a first normal shift register train for transmitting signals in one direction and a second normal shift register train for transmitting signals in an opposite second direction, for enabling a bidirectional scan. Further, the bidirectional normal shift register trains are provided with first and second redundant shift register trains respectively, in order to improve redundancy. The four systems of shift register trains are formed on a substrate independently of each other.

In a limited structure of the present invention, the aforementioned four systems of shift register trains are arranged on the substrate in parallel with each other.

In the drive unit according to the present invention, the four systems of shift register trains for normal/redundant and first/second scan lines are arranged independently of each other, thereby extremely reducing such a probability that a portion causing a defect in a manufacturing process extends over a wide range of the four systems of shift register trains. Thus, occurrence of defectives is reduced and the manufacturing yield is improved.

In a further limited structure of the present invention, either the first normal shift register train or the first redundant shift register train is arranged between the second normal and redundant shift register trains.

Assuming that a defect is caused in the manufacturing process to extend over two adjacent shift register trains, the combination of the shift register trains of the first and second directions is saved as to the remaining two systems of shift register trains according to the aforementioned structure. Thus, a bidirectional scan function is ensured.

In another aspect of the present invention, the drive unit for a display device further comprises video signal input lines for inputting prescribed types of video signals which are different in phase from each other. The video signal input lines are connected with the signal electrodes respectively, so that the video signal input lines output the video signals to the respective signal electrodes based upon a common output signal which is outputted from the shift register with respect to a set of a prescribed number of the signal electrodes which are connected to the respective ones of the video signal input lines. Further, each of the shift register trains has unit shift registers outputting output signals to one set of the signal electrodes in a number which is responsive to the set number of the signal electrodes. The respective unit shift registers of the respective shift register trains are alternately arranged in series on the substrate.

Even if a defect in the manufacturing process is caused between adjacent unit shift registers in the arrangement of the respective unit shift registers of the four systems of shift register trains, the unit shift registers of the remaining two systems of shift register trains are saved according to the aforementioned structure. Thus, reduced is such a probability that all shift register trains are rendered inoperable by a defect.

In a further limited structure of the present invention, the aforementioned substrate has a rectangular pixel region provided with the signal electrodes, the scan electrodes and the pixels, and a shift register forming region extending along one side of the pixel region which is perpendicular to the signal electrodes. The shift register forming region further has unit shift register forming parts corresponding to every pixel region which is connected to one set of signal electrodes, and the respective shift registers of the respective shift register trains are alternately arranged in directions perpendicular to the signal electrodes in the unit shift register forming parts.

According to the aforementioned structure, the shift register forming region is allotted to every pixel region which is connected to a set of four signal electrodes, for example, to define the unit shift register forming parts. Thus, the respective unit shift registers of the four systems of shift registers are alternately arranged in the unit shift register forming parts in series, whereby the shift register forming region can be reduced.

In a further limited structure of the present invention, further, either the first normal shift register train or the first redundant shift register train is arranged between the unit shift registers of the second normal and redundant shift register trains in the unit shift register forming parts.

Even if a defect on the manufacturing process is caused between two adjacent unit shift registers, the unit shift registers of the shift register trains along the first and second directions are saved in the remaining two systems of shift register trains according to the aforementioned structure, whereby the bidirectional scan function can be maintained.

According to a wide aspect of the present invention, provided is a shift register having first normal and redundant shift register trains for transmitting signals in a first direction, and second normal and redundant shift register trains for transmitting signals to a second direction which is opposite to the first direction, and the respective shift register trains are arranged independently of each other.

In the aforementioned shift register, the shift register trains are preferably arranged on a substrate in parallel with each other.

In the shift register according to the present invention, the four systems of shift register trains for normal/redundant and first/second directional scan lines are arranged independently of each other, thereby extremely reducing such a probability that a portion causing a defect in the manufacturing process extends over a wide range of the four systems of shift register trains, whereby occurrence of defectives can be reduced and the manufacturing yield can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 15-19 are diagrams of the invention which illustrate structures as applied to shift register 310 of scan driver 300.

DESCRIPTION OF THE PREFERRED EMBODIMENTS

Embodiments of the present invention are now described with reference to the drawings, for clarifying the present invention.

Figure 1:
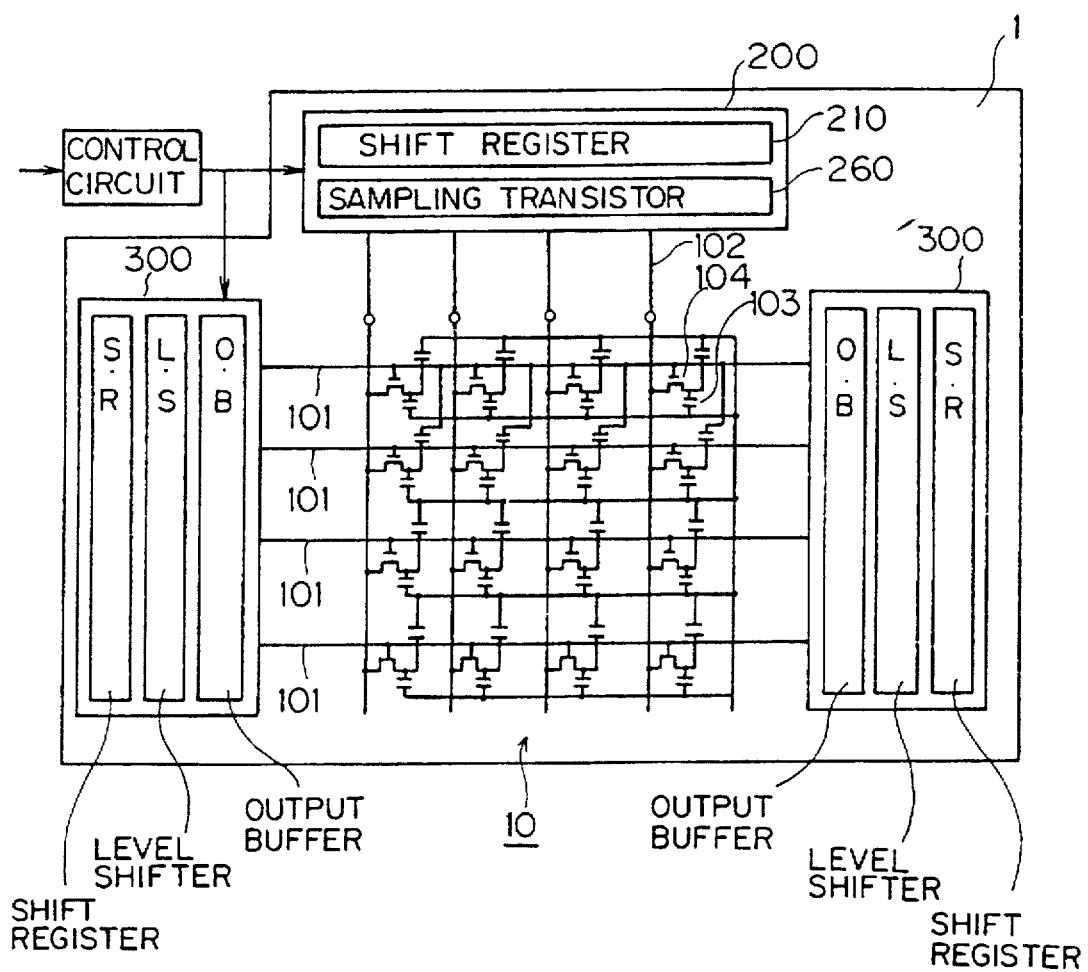
FIG. 1 is an overall structural diagram showing the structure of a matrix type liquid display device according to the present invention.

Referring to FIG. 1, a matrix type liquid crystal display device has the so-called driver integrated structure, comprising a liquid crystal panel 10, a data driver 200 and scan drivers 300 which are formed on a single substrate 1.

The liquid crystal panel 10 comprises a plurality of scan electrodes 101 horizontally extending in parallel with each other, a plurality of signal electrodes 102 extending perpendicularly to the scan electrodes 101 in parallel with each other, TFTs (thin film transistors) 104 which are arranged in the vicinity of intersections between the scan electrodes 101 and the signal electrodes 102, and pixel electrodes 103 which are connected to the TFTs 104. First ends of the scan electrodes 101 are connected to gate electrodes of the respective TFTs 104, while second ends thereof are connected to the scan drivers 300. On the other hand, first ends of the signal electrodes 102 are connected to source electrodes of the TFTs 104, while second ends are connected to the data driver 200.

The data driver 200 samples video signals which are inputted from the exterior at a prescribed sampling frequency, and outputs the video signals to the respective signal electrodes 102 in synchronization with outputs of gate on signals by the scan drivers 300. Thus, the video signals are outputted to the pixel electrodes 103 through the TFTs 104 which are in ON states.

In the matrix type display device having the aforementioned structure, the feature of the present invention resides in a structure related to a shift register of a driving circuit (driver), in particular. Embodiments thereof are now described.

(First Embodiment)

A driving circuit for a matrix type display device according to a first embodiment, a shift register 210 of the data driver 200, for example, has two systems of shift register trains, for enabling a bidirectional scan. Further, redundant lines are provided for the respective ones of the two systems of shift register trains. Therefore, the shift register 210 comprises four systems of shift register trains including a left scan normal shift register train, a left scan redundant shift register train, a right scan normal shift register train, and a right scan redundant shift register train. Further, each shift register train is divided into some blocks along a signal transmission direction. These blocks are connected with each other by a transmission circuit.

Figure 2:
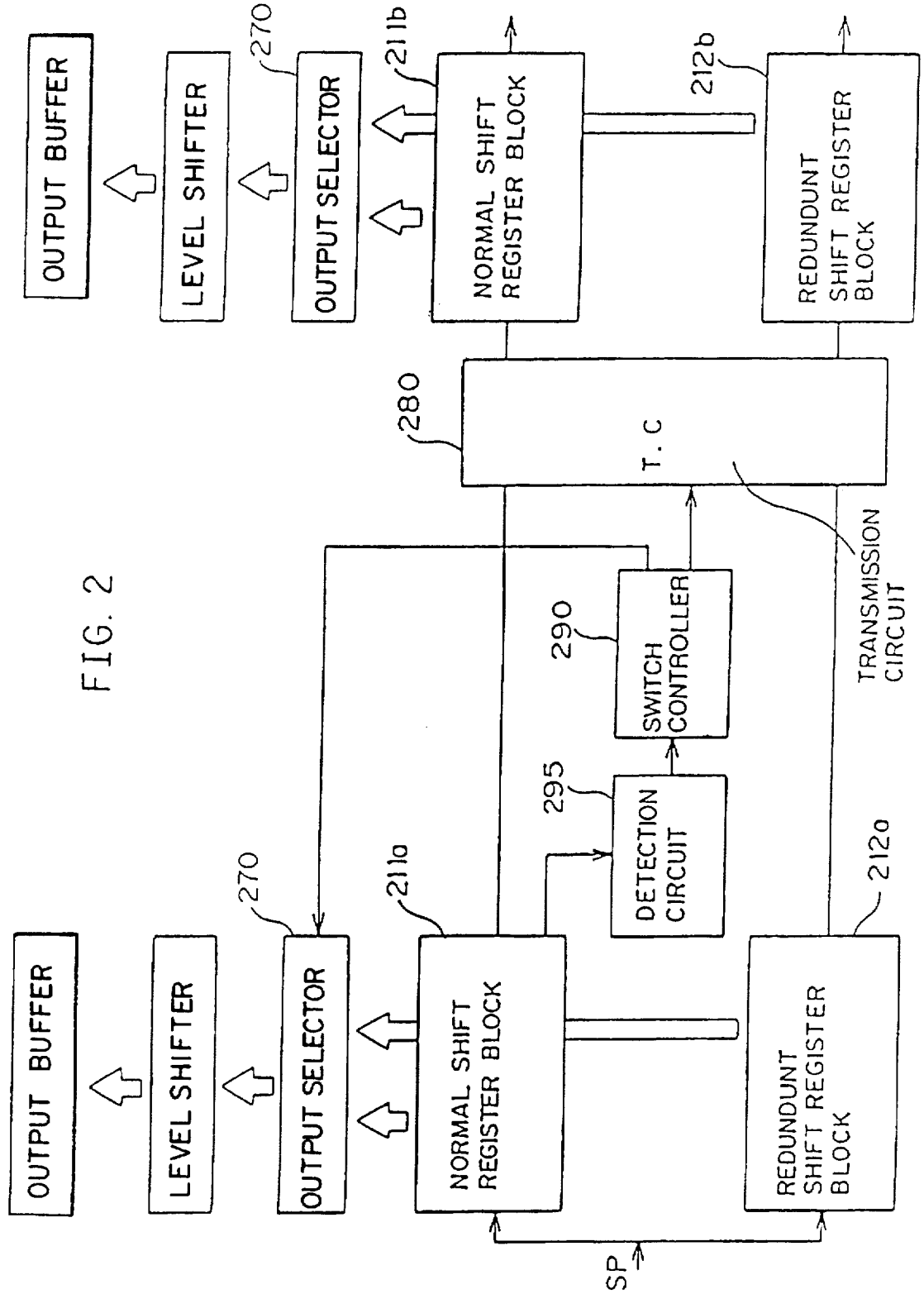
FIG. 2 is a block diagram showing a circuit structure in the vicinity of a shift register of a driving circuit of a matrix type display device according to an embodiment of the present invention.

FIG. 2 is a block diagram showing the structure of the driving circuit including such a shift register. This figure illustrates only shift register trains which are related to a unidirectional scan.

Referring to FIG. 2, a normal line of the shift register has such a structure that normal shift register blocks 211a, 211b, ... divided every block are connected in series with each other through a transmission circuit 280. A redundant line has such a structure that redundant shift register blocks 212a, 212b ... are connected in series with each other through the transmission circuit 280.

Shifts pulses SP are inputted from input ends of the first normal and redundant shift register blocks 211a and 212a respectively, transmitted through the respective shift register blocks at prescribed timings, and thereafter transmitted to the second normal and redundant shift register blocks 211b and 212b through the transmission circuit 280 respectively.

A detection circuit 295 and a switch controller 290 are connected to an output side of the normal shift register block 211a. The detection circuit 295 receives the shift pulse which is transmitted through the normal shift register block, and detects whether or not a normal shift pulse is transmitted through the normal shift register block.

The switch controller 290 receives a detection signal is from the detection circuit 295, for outputting a selection signal as to which one of output signals from the normal and redundant shift register blocks is transmitted to the next stage, while outputting a selection signal as to which one of the output signals from the normal and redundant shift register blocks is transmitted to a sampling transistor 260, to an output selector 270.

Output signals which are taken out from shift registers of the same positions of the normal and redundant shift register blocks 211a and 212a are supplied to the sampling transistor 260 through the output selector 270. The sampling transistor 260 carries out a switching operation in response to the output signal from the output selector 270, for outputting video signals which are inputted from a video line toward the signal electrodes 102.

Figure 3:
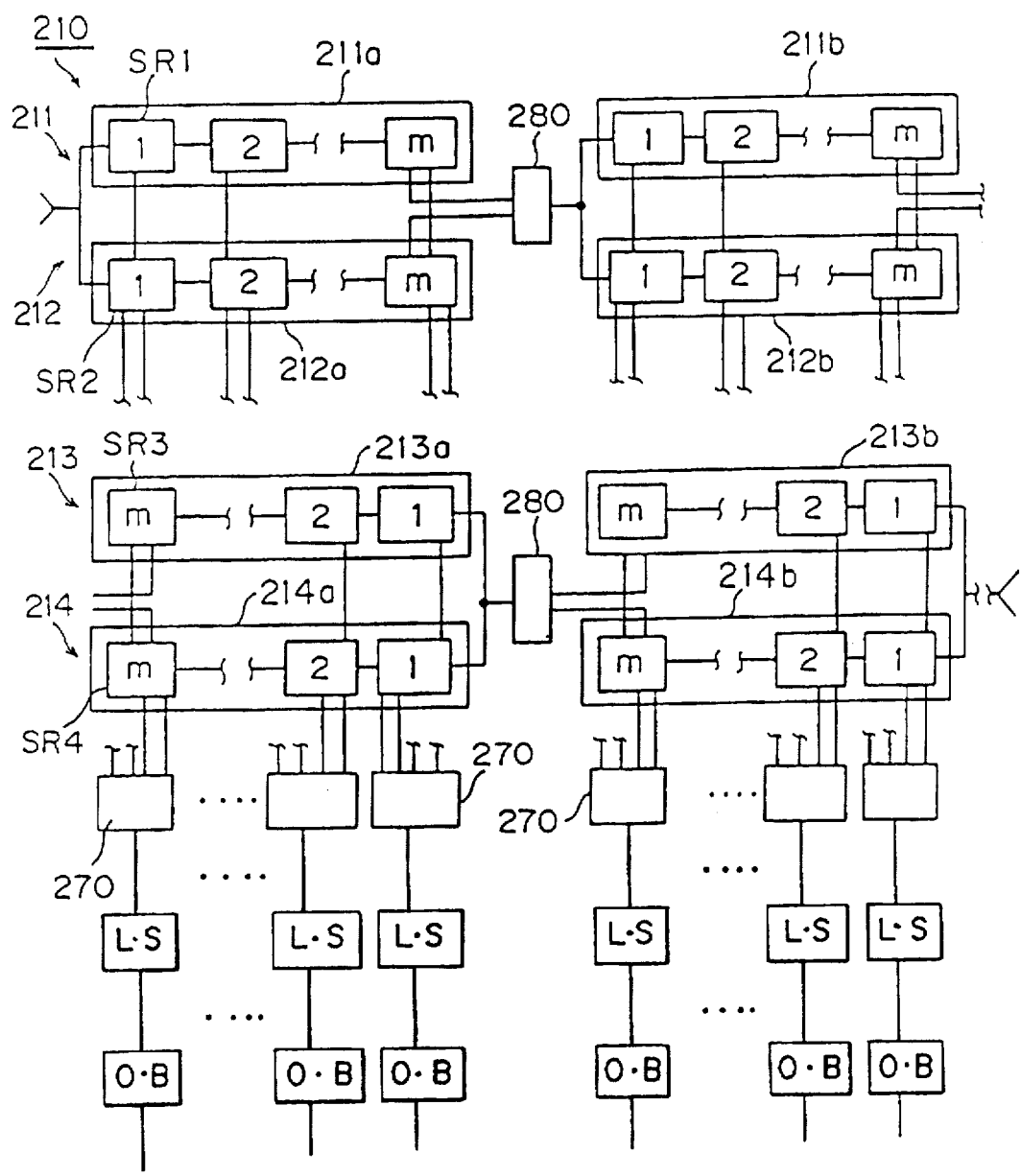
FIG. 3 is an arrangement structural diagram showing a plane arrangement structure of a shift register of a driving circuit according to a first embodiment of the present invention.

FIG. 3 is a plane structural diagram typically showing a plane arrangement structure of the shift register 210 according to the first embodiment of the present invention. Referring to FIG. 3, the shift register 210 is formed by four systems of shift register trains including right scan normal and redundant shift register trains 211 and 212 and left scan normal and redundant shift register trains 213 and 214. The four systems of shift register trains are horizontally arranged in parallel with each other. Each shift register train has such a structure that unit shift registers are divided into blocks every prescribed number (m), so that the respective blocks are connected in series with each other through the transmission circuit 280 along the scan direction.

The transmission circuit 280, the detection circuit 295 (not shown) and the switch controller 290 (not shown) are arranged between the respective blocks of each shift register train.

Further, output selectors 270 are arranged in positions corresponding to unit shift registers SR1 to SR4 of the respective shift register trains, for example. Output ends of the output selectors 270 are connected to gates of sampling transistors 260.

The sampling transistors 260 are connected between a video line 250 for inputting video signals from the exterior and the plurality of signal electrodes 102, for controlling the timings for outputting the video signals from the video line 250 to the signal electrodes 102 by switching operations thereof.

The structures of the respective parts of the data driver 200 are further described.

Figure 4:
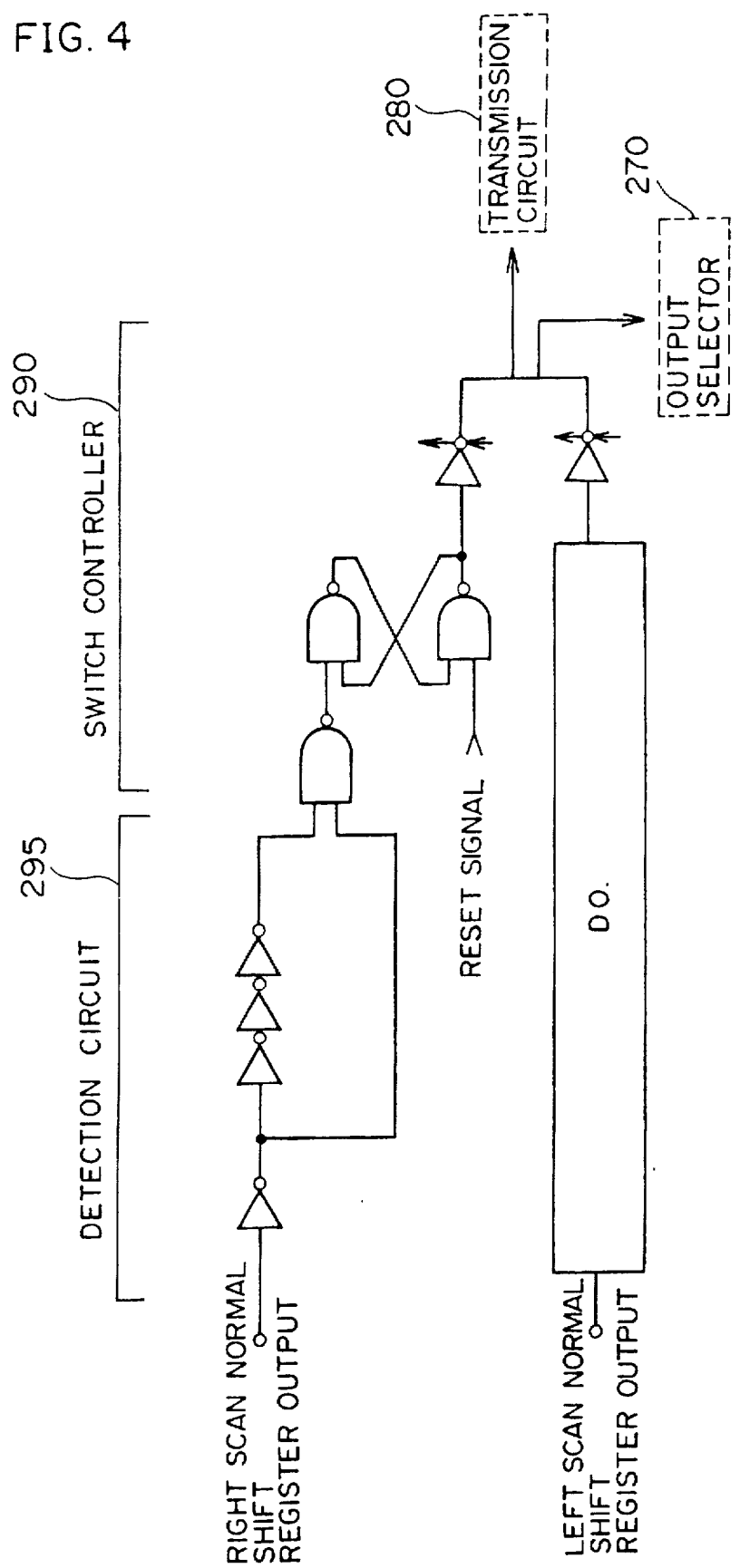
FIG. 4 is a circuit diagram of a detection circuit and a switch control according to the present invention.

FIG. 4 is a circuit diagram showing the circuit structures of the detection circuit 295 and the switch controller 290. The detection circuit 295 receives output signals from final stage shift registers of the respective blocks of the right scan normal shift register train and those from final stage shift registers of the respective blocks of the left scan normal shift register train. The detection circuit 295 further detects correctness/erroneousness of the shift pulses which are transmitted through the normal shift register trains, for outputting a signal to the switch controller 290 for turning on a redundant side transfer gate upon detection of no normal pulses, or turning on a normal side transfer gate upon detection of normal shift pulses.

The switch controller 290 receives the detection signal from the detection circuit 295, generates a control signal for turning on either one of transfer gates 281 and 282 (see FIG. 5) of the transmission circuit 280, and outputs the same to the transmission circuit 280. The switch controller 290 also outputs a control signal to the output selector 270 for selecting any one of outputs of the normal/redundant shift register trains.

Figure 5:
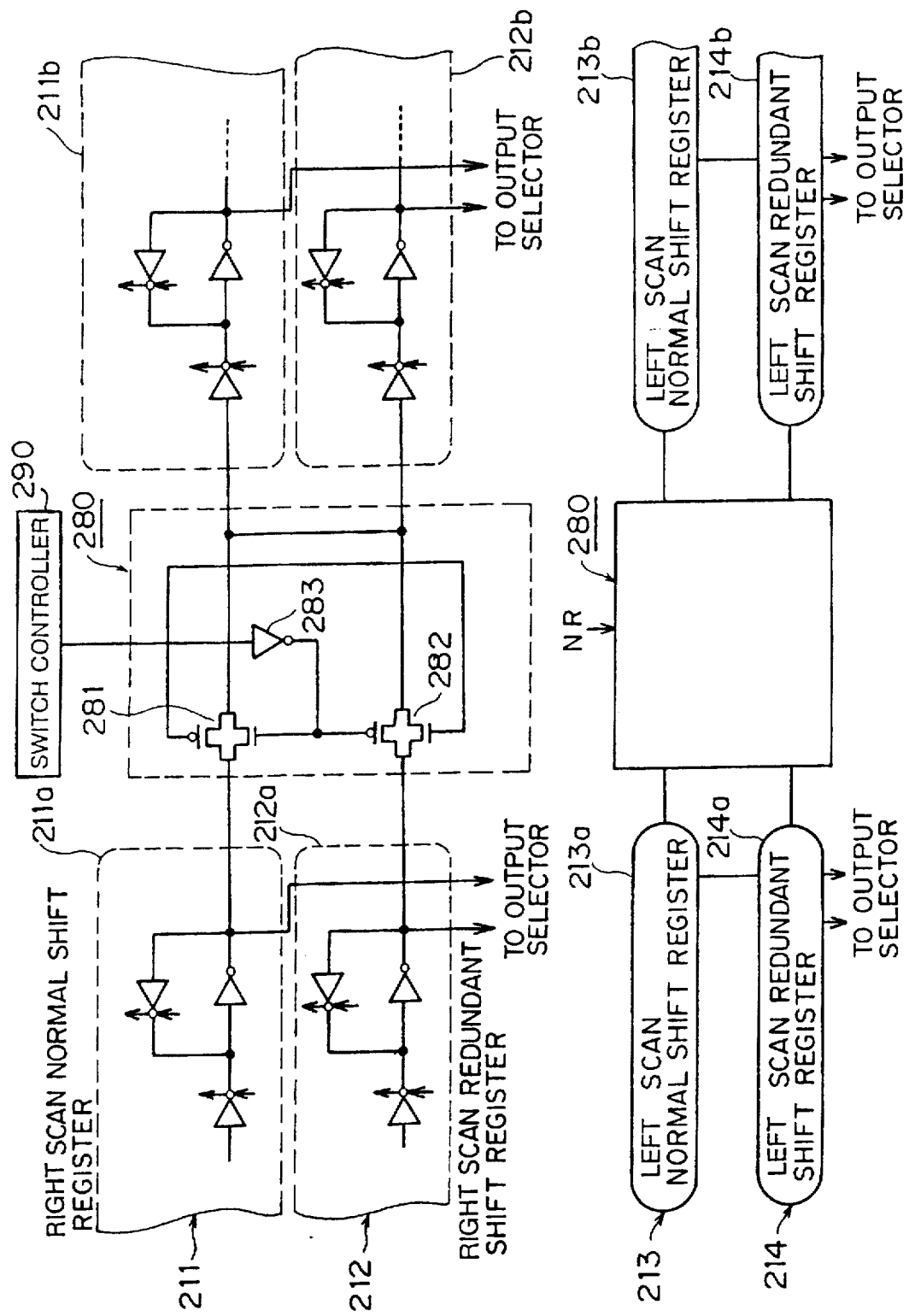
FIG. 5 is a circuit diagram showing a circuit structure in the vicinity of a transmission circuit of the shift register shown in FIG. 2.

FIG. 5 is a circuit diagram showing a circuit structure in the vicinity of the transmission circuits 280. This figure illustrates the circuit structure of the transmission circuit 280 which is provided between the right scan shift register blocks, for example. This transmission circuit 280 has two transfer gates 281 and 282 and one inverter 283. The first and second transfer gates 281 and 282 have input ends which are connected to output ends of the right scan normal and redundant shift register blocks 211a and 212a respectively. Output ends of the two transfer gates 281 and 282 are connected in common with each other, and thereafter connected to the next stage right scan normal and redundant shift register blocks 211b and 212b respectively. The two transfer gates 281 and 282 are so connected that different voltages are applied to gate electrodes thereof through the inverter 283. The first and second transfer gates 281 and 282 carry out ON/OFF operations in response to a control signal which is supplied from the switch controller 290, to select and output any of the output signals of the right scan normal and redundant shift register blocks 211a and 212a.

A concrete operation of the transmission circuit 280 is now described. It is assumed that some defect is caused in the right scan normal shift register block 211a and an output signal of a block end is fixed at a high level, for example. In this case, the detection circuit 295 detects that abnormality is caused in the right scan normal shift register 211a, and the switch controller 290 outputs a control signal for turning off the first transfer gate 281. Thus, the first transfer gate 281 is turned off and the second transfer gate 282 is turned on in the transmission circuit 280. Consequently, the output signal from the normal right scan redundant shift register block 212a is outputted on the output side of the transmission circuit 280. This output signal is transmitted as shift pulses for driving the next stage shift register blocks 211b and 212b. Thus, even if a defect is caused in the right scan normal shift register block 211a, the normal output signal from the right scan redundant shift register block 212a is transmitted to the next stage, thereby preventing interception of transmission of the shift pulses. According to this embodiment, the switch controller 290 supplies control signals so that the output from the right scan normal shift register block 211a is regularly inputted in the next stage shift register blocks when no defect is caused.

The transmission circuit 280 employing the transfer gates causes no signal transmission delay as compared with a conventional NOR gate. Therefore, it is possible to suppress occurrence of image irregularity which is caused by displacement in sampling timing for video signals between the blocks, as compared with the prior art.

While the detection circuit 295 is adapted to monitor only the states of the normal shift register trains, the same may alternatively monitor both states of the normal and redundant register trains. In this case, the switch controller 290 outputs a control signal to the transmission circuit 280 for selecting a signal of a remaining register trains when a defect is caused in either register trains.

Figure 6:
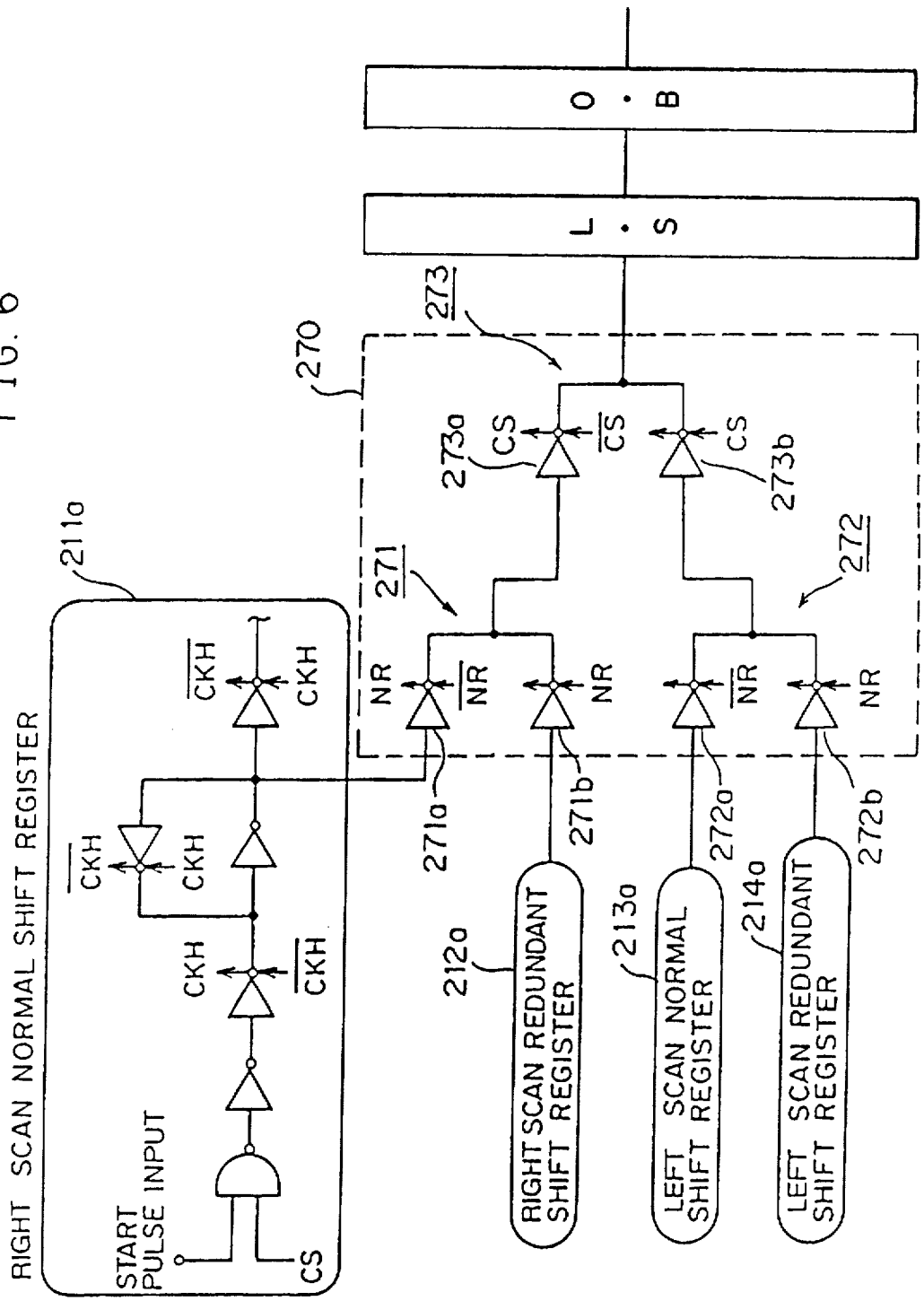
FIG. 6 is a circuit diagram showing a circuit structure in the vicinity of an output selector of the shift register shown in FIG. 2.

The structure and the operation of the output selector 270 are now described. FIG. 6 shows a circuit structure in the vicinity of the output selector 270. This output selector 270 is adapted to select output signals (shift signals) which are outputted from the same positions of the four systems of shift register blocks 211a, 212b, 213a and 214a for outputting the same to the sampling transistor 260. The output selector 270 is formed by connecting three selection circuits 271, 272 and 273. The respective selection circuits are formed by wired OR connecting pairs of clocked inverters 271a, 271b, . . . . The first selection circuit 271 selects output signals from the right scan normal and redundant shift register blocks 211a and 212b, and the second selection circuit 272 selects output signals from the left scan normal and redundant shift registers 213a and 214a, while the third selection circuit 273 selects output signals from the left and right scan shift register blocks.

A concrete operation of the output selector 270 is now described. When both of right scan normal and redundant line shift registers are in normal states in a right scan, for example, the switch controller 290 outputs an NR signal to turn on the clocked inverter 271a for the right scan normal shift register block 211a while turning off the clocked inverter 271b for the right scan redundant shift register 212a. An output signal of the right scan normal shift register block 211a on the first selection circuit 271 side is outputted to the third selection circuit 273. In the third selection circuit 273, the clocked inverters 273a and 273b for right and left scans are turned on and off respectively by a CS signal from an external control circuit. Thus, only an output signal which is inputted from the first selection circuit 271 for a right scan is inverted and outputted to the sampling transistor 260.

When a defect is caused in the right scan normal shift register block 211a in a right scan, on the other hand, the detection circuit 295 detects this and outputs the result of the detection to the switch controller 290. The switch controller 290 outputs an NR signal for turning on only the clocked inverter 271b which is connected to the right scan redundant shift register block 212a side. Consequently, the first selection circuit 271 selects a normal output signal which is outputted from the right scan redundant shift register block 212b, so that the normal output signal is supplied to the sampling transistor 260 through the clocked inverter 273a for selecting a right scan.

Thus, the shift register according to this embodiment can normally continue signal transmission between the blocks for outputting normal signals to the sampling transistor 260 even if a defect is caused in the shift signal transmission system.

In the shift register of this embodiment, further, the four systems of shift register trains 211 to 214 are horizontally arranged in parallel with each other along the scan electrodes 101. Due to such an arrangement structure, it is possible to improve redundancy against a defect caused in the manufacturing process for this device. When a defect is caused in any one of the four systems of shift register trains, for example, a left or right scan can be continued by the remaining three systems of shift register trains.

When a defect extending over the normal/redundant shift register trains of the same scan direction is caused, for example, it is possible to maintain driving states of the shift register trains of the remaining scan direction. Thus, it is possible to maintain at least a unidirectional scan function.

When a defect is caused over the right scan redundant shift register train 212 and the left scan normal shift register train 213, further, it is possible to maintain a bidirectional scan function by the remaining right and left scan redundant shift register trains 211 and 214.

(Modification of First Embodiment)

Figure 7:
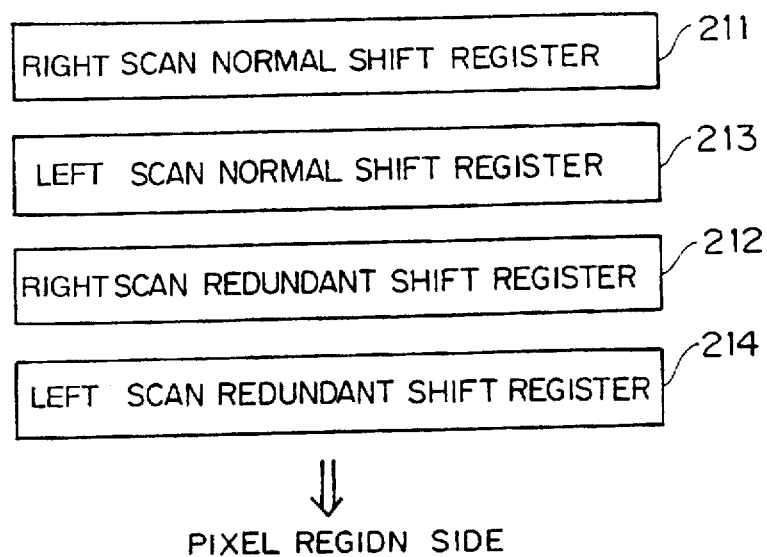
FIG. 7 is an arrangement diagram of a shift register showing a modification of the first embodiment shown in FIG. 3.

FIG. 7 illustrates a modification of the arrangement of the shift register trains according to the first embodiment. Referring to FIG. 7, shift register trains having different scan directions are alternately arranged. When a defect extending over two shift register trains is caused in this arrangement, the remaining two systems of shift register trains necessarily have different scan directions, whereby a bidirectional scan function is not damaged.

The scan directions in the arrangements shown in FIGS. 3 and 7 may alternatively be exchanged, to attain similar effects.

(Second Embodiment)

The structure of a driving circuit for a matrix type liquid crystal display device according to a second embodiment of the present invention is now described with reference to FIG. 8. A data driver 200 according to the second embodiment has four systems of video lines 250a, 250b, 250c and 250d for inputting four types of video signals, which are 90° out of phase from each other, respectively. The four systems of video lines 250a to 250d are connected to four signal electrodes 102a, 102b, 102c and 102d through sampling transistors 260a, 260b, 260c and 260d respectively.

Gate electrodes of the four sampling transistors 260a to 260d are connected to the output selector 270, to be supplied with common output signals from the output selector 270. Output signals of unit shift registers SR1, SR2, SR3 and SR4 of four systems of shift register trains 211 to 214 are inputted in the output selector 270. Due to such a circuit structure, one unit shift register SR1, SR2, SR3 or SR4 selected by the output selector 270 simultaneously turns on the four sampling transistors 260a to 260d. Further, the video signals which are 90° out of phase from each other are outputted from the four systems of video lines 250a to 250d to the four signal electrodes 102a to 102d respectively. Namely, the data driver according to this embodiment can simultaneously control four pixels by an output signal from one stage shift register.

In the shift register, further, four series of shift register trains are provided for four systems of left and right scan normal/redundant shift registers. In the four series of shift register trains, a shift register of each stage of each series controls four pixels of video signals. Therefore, when normal shift register trains carry out a right scan, for example, output of video signals is controlled by shift signals which are inputted from respective input ends of four series of shift registers of the right scan normal shift register train.

Figure 8:
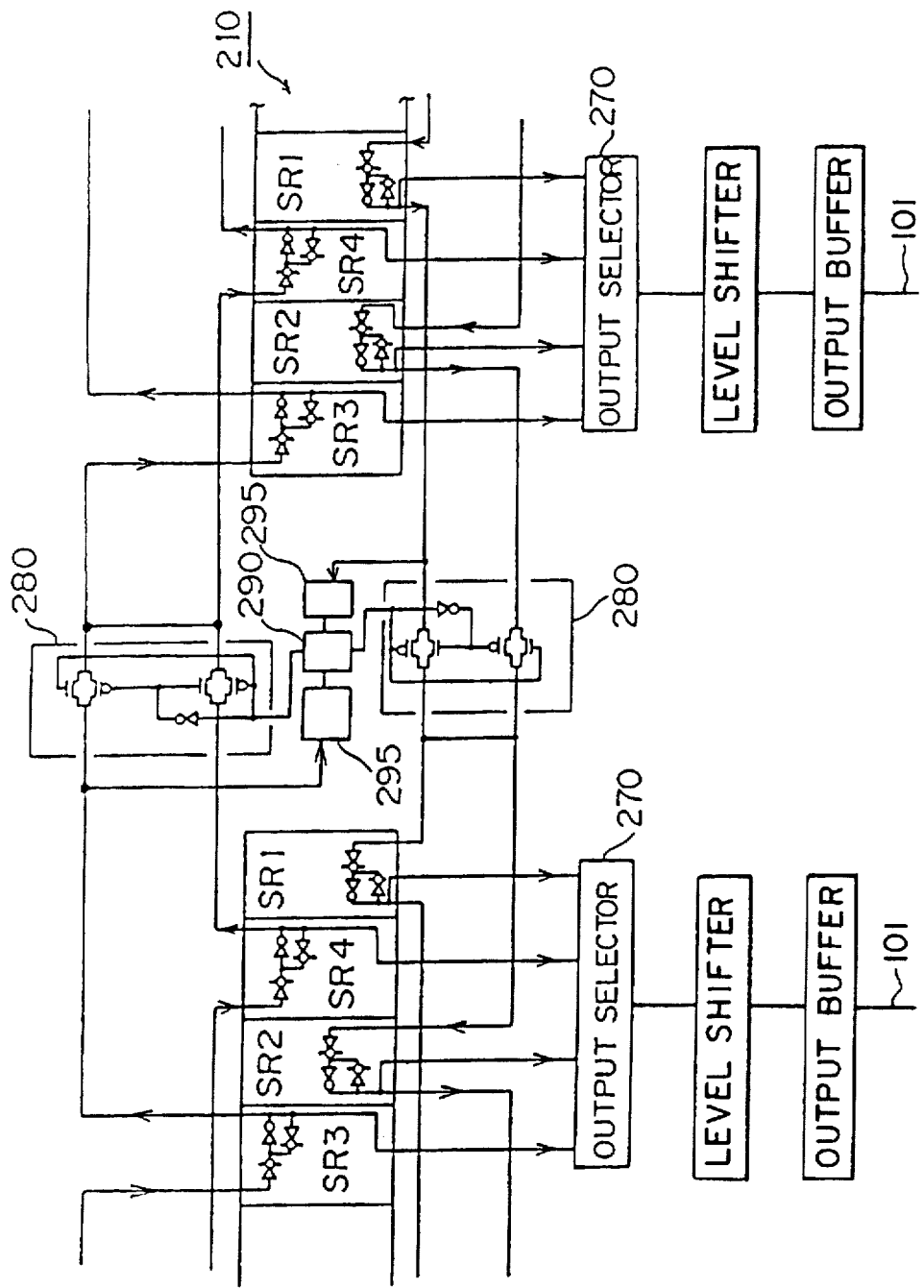
FIG. 8 is a circuit diagram showing the circuit structure of a driving circuit according to a second embodiment of the present invention.
Figure 9:
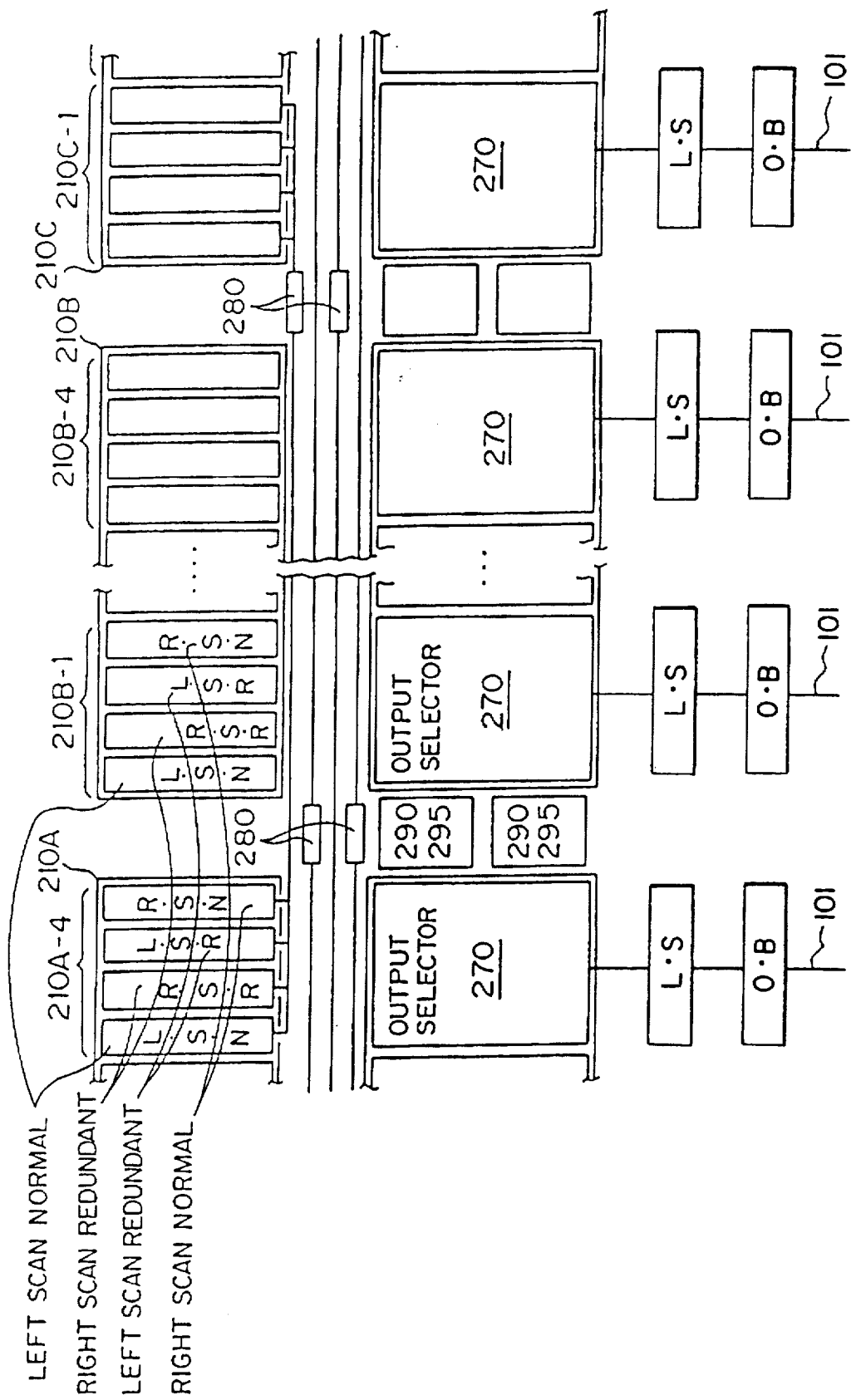
FIG. 9 is a plane arrangement structural diagram of the driving circuit shown in FIG. 8.
Figure 10:
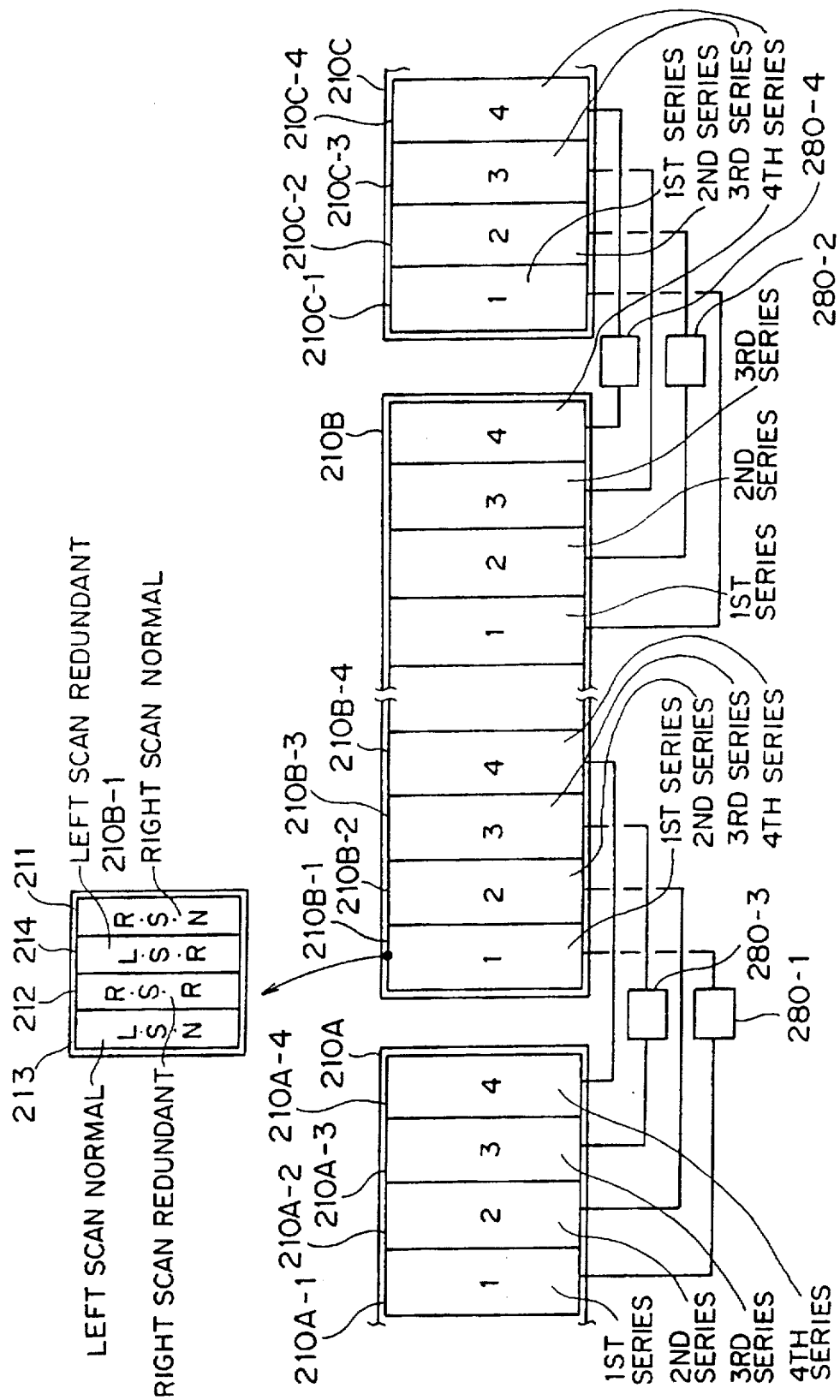
FIG. 10 is a plane arrangement structural diagram showing a principal part of a shift register appearing in FIG. 9.

FIG. 9 is a plane arrangement structural diagram of the driving circuit shown in FIG. 8, and FIG. 10 is a plane arrangement structural diagram of the shift register thereof. The shift register 210 is divided into some blocks 210A, 210B, 210C, . . . along the horizontal direction. Shift registers of four systems and four series are alternately arranged every stage in each block. In the block 210B, for example, a left scan normal shift register 213B, a right scan redundant shift register 212B, a left scan redundant shift register 214B and a right scan normal shift register 211B of a first series 210B-1 are arranged in this order from the left side in FIG. 10, and shift registers of second, third and fourth series 210B-2, 210B-3 and 210B-4 are arranged in a similar manner thereto.

Transmission circuits 280-1 to 280-4 are arranged between the respective blocks. For example, the transmission circuits 280-1 and 280-3 are arranged between the blocks 210A and 210B for connecting the first and third series of shift registers, while the transmission circuits 280-2 and 280-4 are arranged between the blocks 210B and 210C for connecting the second and fourth series of shift registers. The four systems of unit shift registers 211B to 214B are formed in a horizontal region (unit shift register forming region) corresponding to horizontal four pixels in a pixel region connected with the four signal electrodes 102a to 102d. Even if a defect in a manufacturing process is caused in a position extending over two unit shift registers 213B and 212B, for example, the remaining two unit shift registers are saved due to the aforementioned arrangement. Thus, a bidirectional scan function is maintained.

The output selectors 270 are arranged in vertical lower regions corresponding to the four systems of unit shift registers. Further, detection circuits 295 and switch controllers 290 are arranged between the divided shift register blocks 210A, 210B, 210C etc. As shown in FIG. 9, the detection circuits and the switch controls which are connected to the first and third series of shift registers and those connected to the second and fourth series of shift registers are alternately arranged between different shift register blocks. The output selectors, the detection circuits and the switch controllers have circuit structures which are similar to those in the case of the first embodiment, and hence redundant description is omitted.

(Modification of Second Embodiment)

Figure 11:
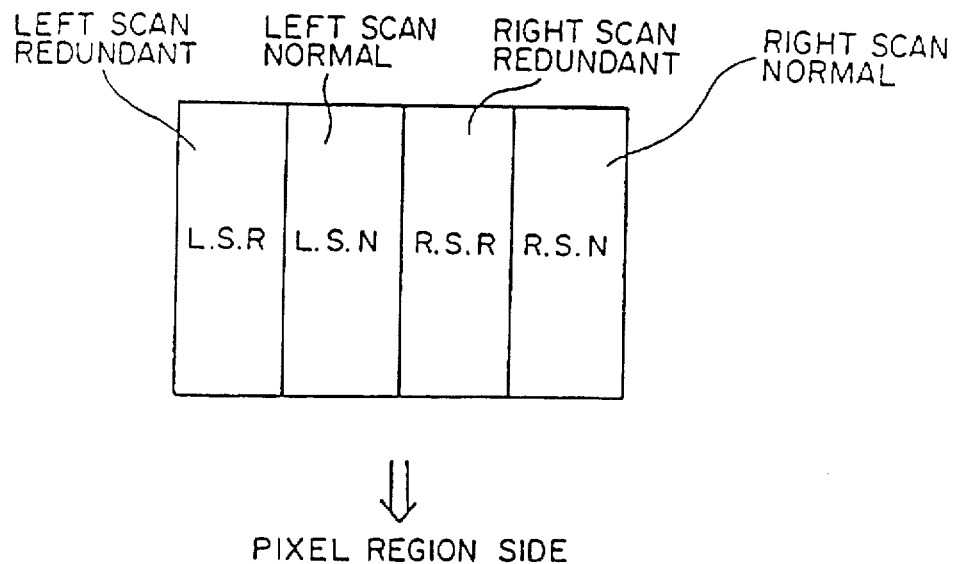
FIG. 11 is a plane arrangement structural diagram showing a modification of the arrangement of the shift register shown in FIG. 9.
Figure 12:
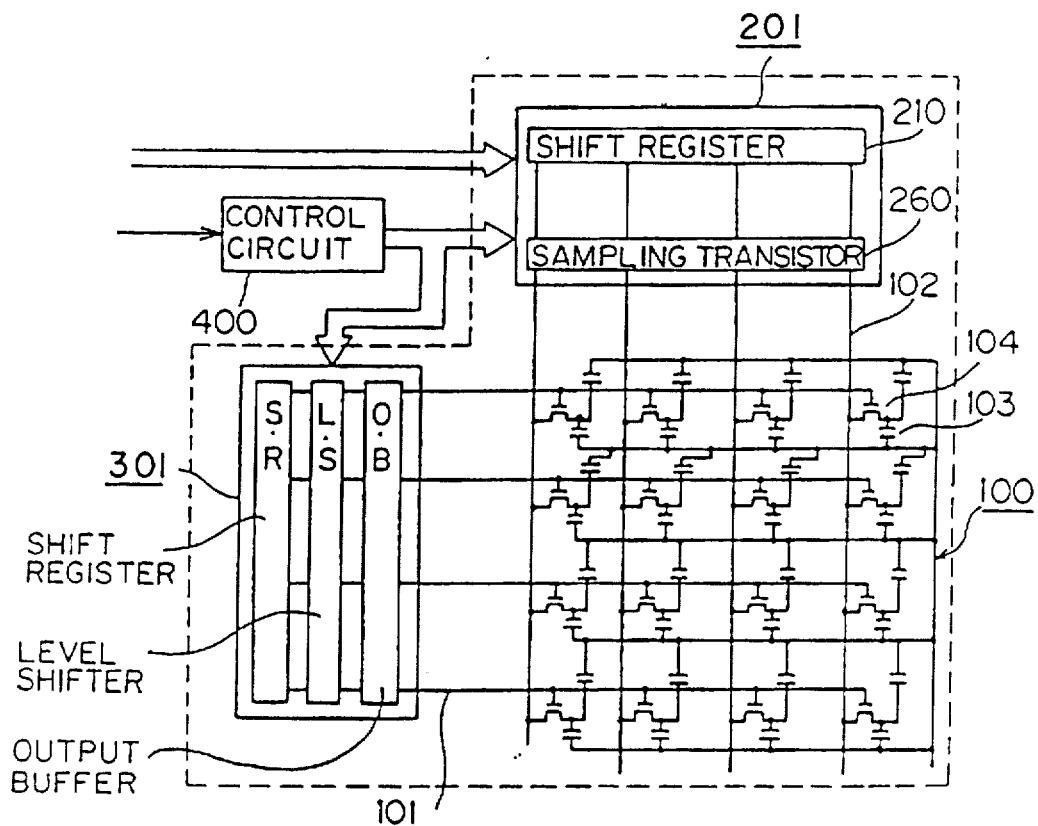
FIG. 12 is an overall structural diagram of a matrix type liquid display device according to prior art.
Figure 13:
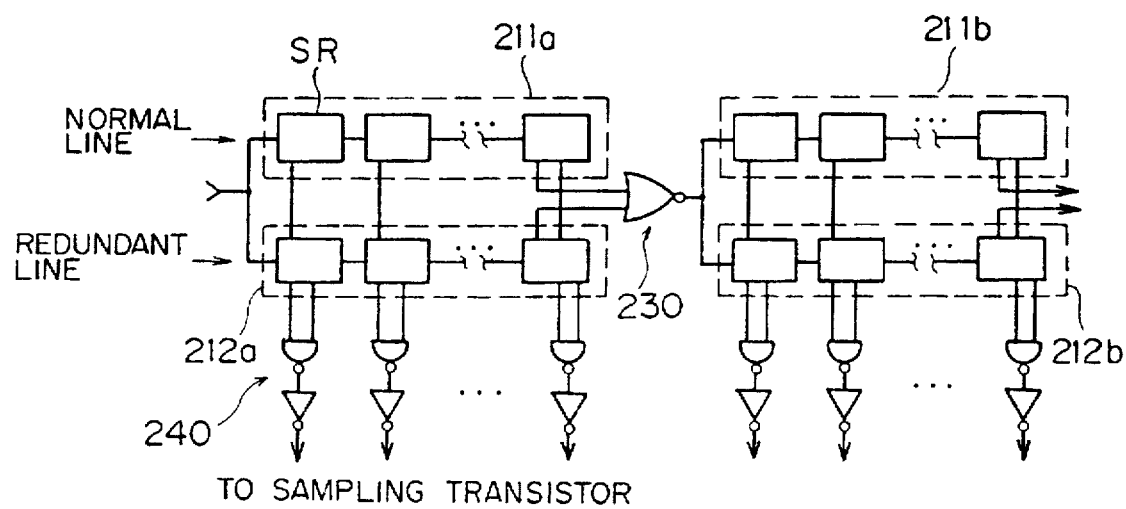
FIG. 13 is a circuit diagram showing the circuit structure of a conventional shift register shown in FIG. 12.
Figure 14:
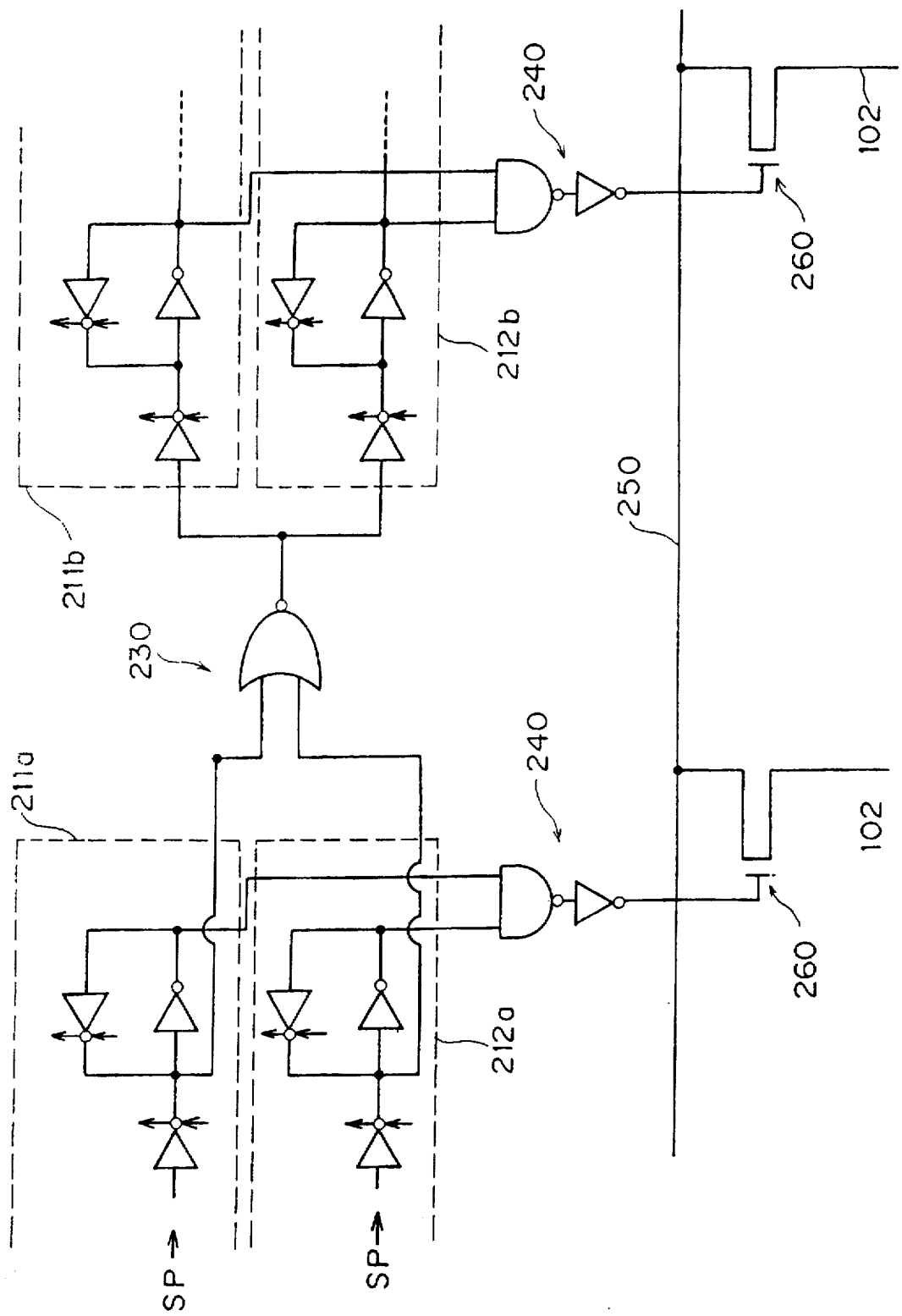
FIG. 14 is a circuit diagram of the shift register and an output selector shown in FIG. 13.
Figure 15:
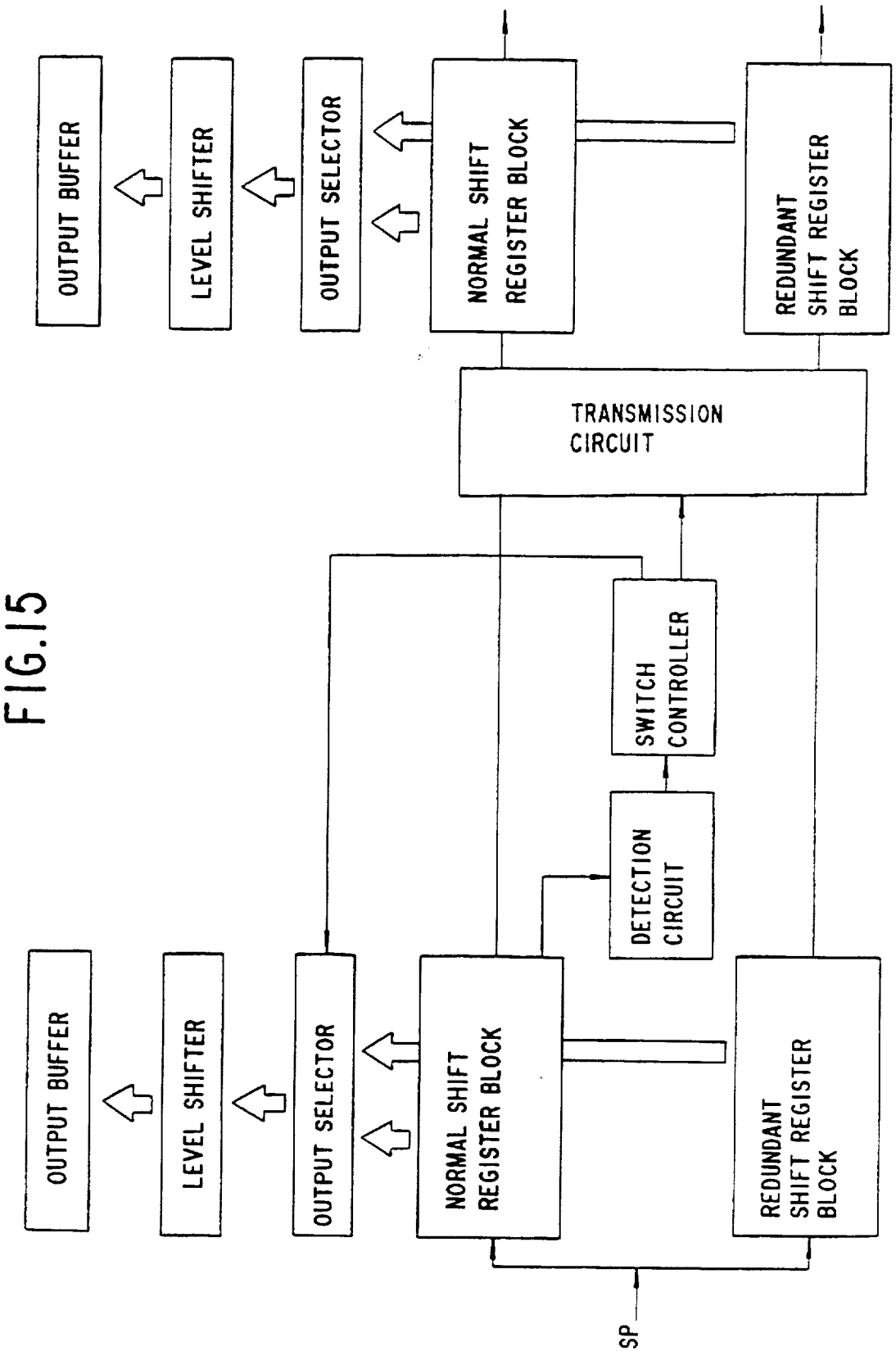
Figure 16:
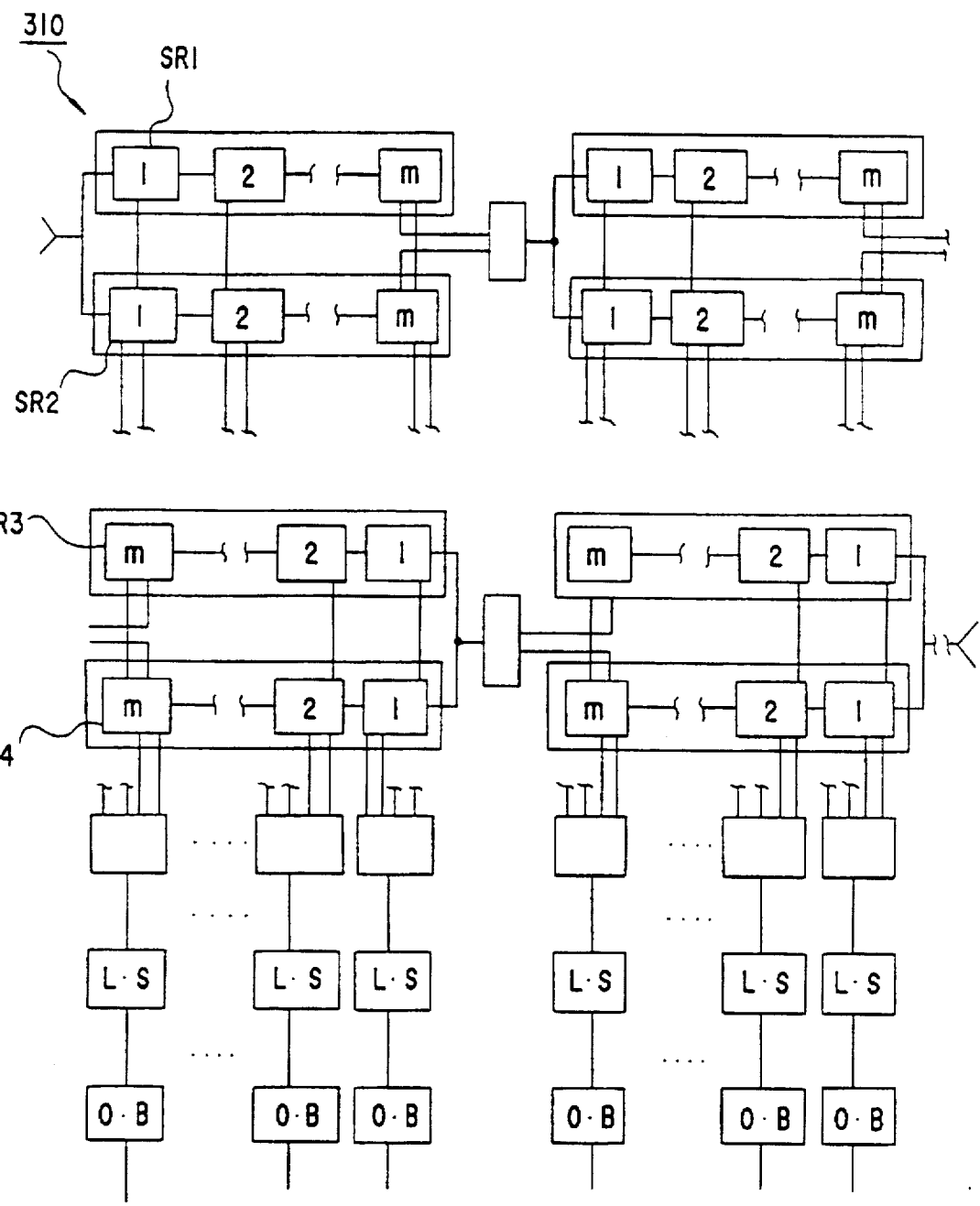
Figure 17:
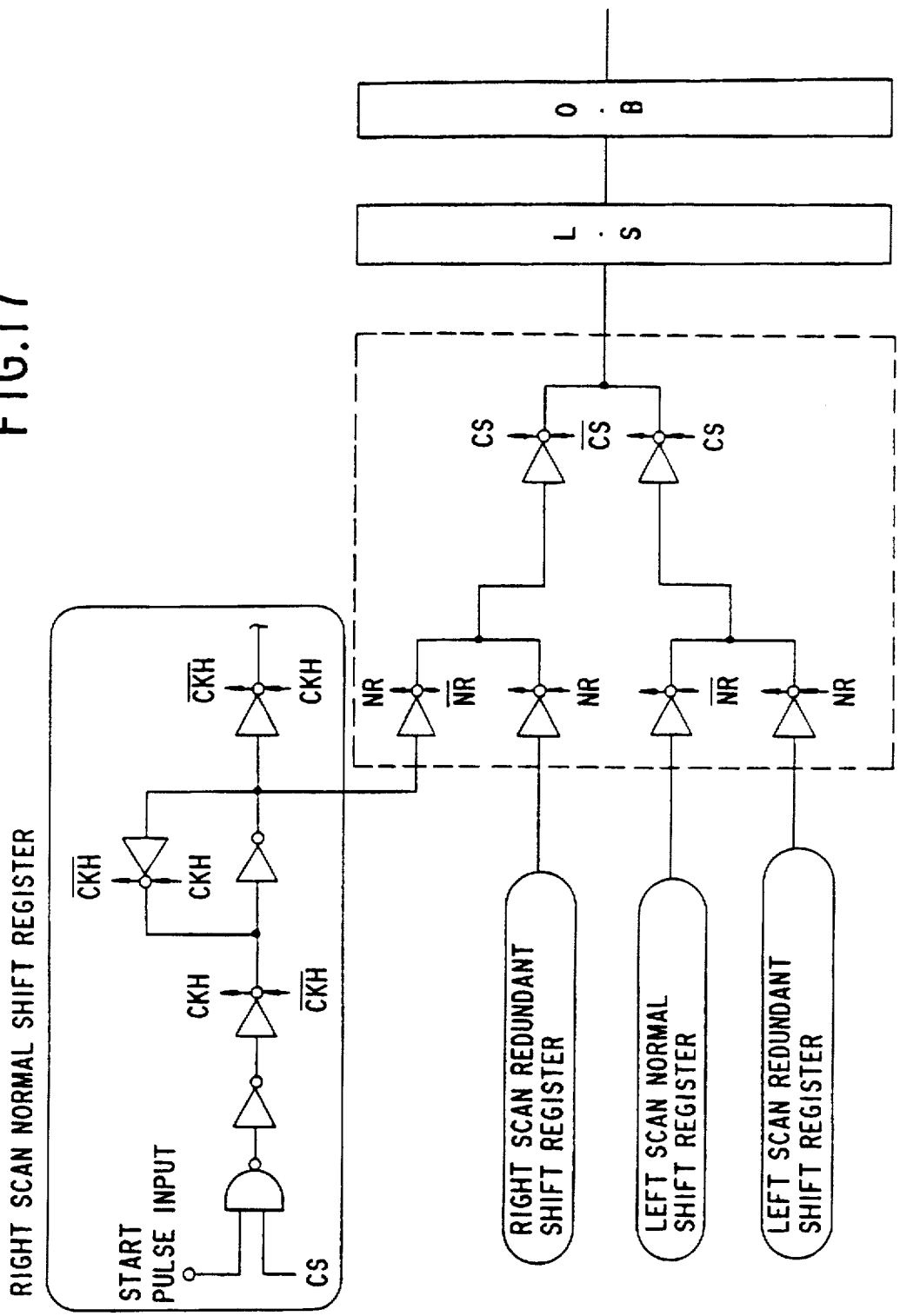
Figure 18:
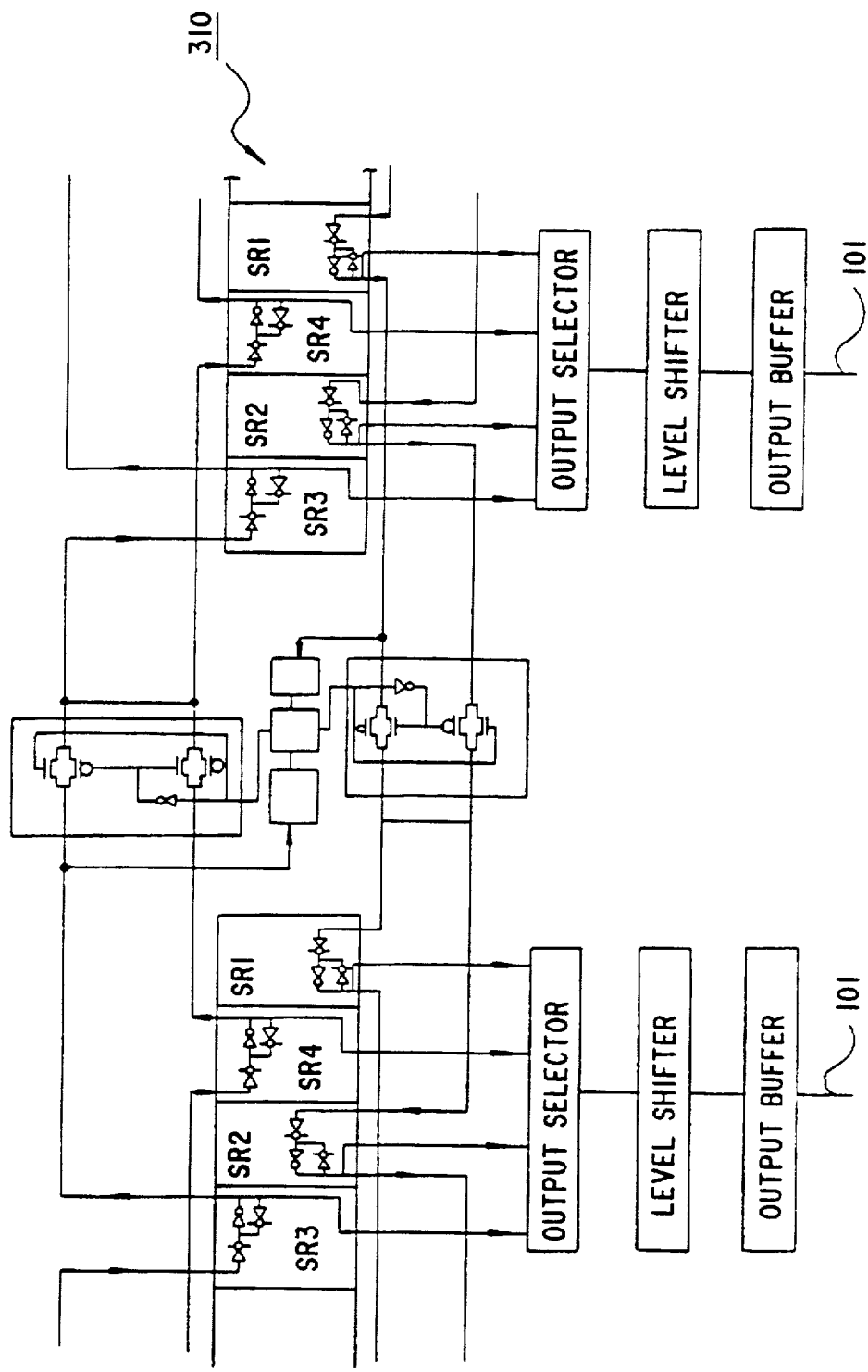

FIG. 11 is a plane arrangement diagram showing a modification of the method of arranging shift registers according to the second embodiment. It is also possible to alternately arrange four systems of unit shift registers in the illustrated order. In this structure alternately arranging four systems of unit shift registers in the horizontal direction, it is possible to reduce a shift register forming region as compared with the structure of the first embodiment shown in FIG. 3. Thus, it is possible to compactly form the structure of the overall driving circuit.

In the first and second embodiments, the shift registers, the transmission circuits, the output selectors, the detection circuits, the switch controls and the like are formed by TFTs, for example, as switching elements. The TFTs have polysilicon layers which are provided with source/drain and channel regions, and gate electrodes of a polycide structure having tungsten silicide or the like. These can be simultaneously and integrally formed on the same substrate as a pixel region by the same process by being provided in structures similar to those of TFTs which are employed for switching elements for respective pixels.

While each of the first and second embodiments has been described with reference to the so-called driver integrated matrix type liquid crystal display device, the structure of the driving circuit is also applicable to a driving circuit which is separated from a liquid crystal panel.

The display device is not restricted to a liquid crystal display device, but the present invention is also applicable to a display device having other pixels.

As to each of the first and second embodiments, the following modifications are further applicable:

(1) The transmission circuit 280 between the shift register blocks can be replaced by the same structure as the selection circuits 271 to 273 of the output selector 270. On the other hand, it is possible to replace each of the selection circuits 271 to 273 of the output selector 270 by the structure of the transmission circuit 280.

(2) While each of the embodiments has been described with reference to the structure of the shift register 210 of the data driver, the aforementioned structure can also be applied to a shift register of the scan driver 300. FIGS. 15–19 illustrate such structures as applied to shift registers 310 of scan driver 300.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A shift register comprising:
   a first normal shift register train and a first redundant shift register train for transmitting signals in a first direction; and
   a second normal shift register train and a second redundant shift register train for transmitting signals in a second direction being opposite to said first direction,
   said shift register trains being arranged on a substrate parallel with each other,
   wherein either one of said first normal shift register train and said first redundant shift register train being arranged between said second normal shift register train and said second redundant shift register train.

2. A drive unit for a display device having a shift register for successively outputting prescribed signals to a plurality of sampling transistors or scan electrodes being connected with a plurality of pixels, said drive unit comprising:
   a substrate; and
   said shift register having a first normal shift register train and a first redundant shift register train for transmitting signals in a first direction, and a second normal shift register train and a second redundant shift register train for transmitting signals in a second direction being opposite to said first direction, respective said shift register trains being arranged on said substrate independently of and parallel to each other, wherein either one of said first normal shift register train and said first redundant shift register train is arranged between said second normal shift register train and said second redundant shift register train.

3. A drive unit for a display device having a shift register for successively outputting prescribed signals to a plurality of sampling transistors or scan electrodes being connected with a plurality of pixels, said drive unit comprising:

a substrate; and said shift register having a first normal shift register train and a first redundant shift register train for transmitting signals in a first direction, and a second normal shift register train and a second redundant shift register train for transmitting signals in a second direction being opposite to said first direction, respective said shift register trains being arranged on said substrate independently of each other, said apparatus further comprising a prescribed number of video signal input lines for inputting prescribed types of video signals being different in phase from each other, said video signal input lines outputting said video signals to said sampling transistors based upon a common output signal, which is output from said shift register trains, with respect to a set of said signal electrodes being connected to respective ones of said video signal input lines, wherein said set of said sampling transistor are in a number corresponding to said prescribed number of said video signal input lines, each of said shift register trains having unit shift registers outputting said common output signal to one set of said sampling transistors in a number being responsive to said set number of said signal electrodes, respective said unit shift registers of respective said shift register trains being alternately arranged in series on said substrate.

4. The drive unit for a display device in accordance with claim 3, wherein said substrate has a rectangular pixel region being provided with said sampling transistors, said scan electrodes and said pixels, and said shift register forming region extending along one side of said pixel region being perpendicular to said sampling transistors, said shift register forming region further having unit shift register forming parts corresponding to every said pixel region being connected to one set of said sampling transistors, respective said shift register of respective said shift register trains being alternately arranged in directions perpendicular to said sampling transistors in said unit shift register forming parts.

5. The drive unit for a display device in accordance with claim 4, wherein said unit shift register of either one of said first normal shift register train and said first redundant shift register train is arranged between said unit shift registers of said second normal shift register train and those of said second redundant shift register train.

6. The drive unit for a display device in accordance with claim 3, wherein said unit shift register of either one of said first normal shift register train and said first redundant shift register train is arranged between said unit shift register of said second normal shift register train and those of said second redundant shift register train.

* * * * *